United States Patent [19]

Grice

[11] Patent Number: 4,656,615
[45] Date of Patent: Apr. 7, 1987

[54] HYDROPHONE ARRAY POLARITY TEST CIRCUIT

[75] Inventor: Gordon T. Grice, Houston, Tex.

[73] Assignee: Digicon, Inc., Houston, Tex.

[21] Appl. No.: 744,323

[22] Filed: Jun. 13, 1985

[51] Int. Cl.$^4$ .......................................... G01R 31/02
[52] U.S. Cl. ...................................... 367/13; 324/51;
340/513; 340/514; 340/653
[58] Field of Search ...................... 367/13; 73/1 DV;
324/51; 340/512, 513, 514, 653

[56] References Cited

U.S. PATENT DOCUMENTS 4,184,143 1/1980 Stafford ................................ 367/13
4,320,468 3/1982 Montross ............................. 367/13

Primary Examiner—Deborah L. Kyle
Assistant Examiner—Ted L. Parr
Attorney, Agent, or Firm—Vaden, Eickenroht, Thompson & Boulware

[57] ABSTRACT

Each hydrophone receiver element is attached in electrical parallel with the series combination of a switching diode and a zener diode so that the physical orientation of the element is the same for each element network. The response element networks then are assembled into a cable section, the element networks constituting a group array. A test circuit applies a relatively high dc voltage input to the cable section. The switching diodes are not rendered conductive for the elements properly connected. Hence, the output is substantially the same as the input. However, if one or more of the elements are reverse connected, the switching diode for that response element is rendered conductive and the output drops to the level of the zener breakdown voltage. Hence, the whole array-connected group can be tested with a single test.

10 Claims, 2 Drawing Figures

HYDROPHONE ARRAY POLARITY TEST CIRCUIT

BACKGROUND OF THE INVENTION

1. Field of the Invention

This invention pertains to marine seismic streamer cables having a plurality of hydrophone receivers positioned therealong, each of said receivers including a pressure acceleration response element, and more specifically to the testing of said hydrophone receivers for proper polarity connection.

2. Description of the Prior Art

A marine seismic streamer cable typically comprises a plurality of sections of standard length cables, commonly 50 meters long, connected together to form a streamer, commonly in excess of 3 kilometers. Each streamer cable length contains a plurality of hydrophone receivers, which are pressure sensitive devices having an acceleration response element. These receivers can be connected into the cable in many ways. Of course, the simplest way for the hydrophones to be connected into the cable would be as individual receivers. However, this is not the most common way. The most common way for the receivers to be connected is in a standard group or array. Typically, seven separate hydrophone receivers evenly spaced apart are connected together to form an array.

The response element of the hydrophone can take on many forms, but the most common form includes a piezoelectric crystal, which responds differently to a pressure wave depending on its orientation. In a first orientation, a pressure wave with a positive onset results in an electrical voltage response signal of the same polarity. That is, a positive pressure wave produces a positive electrical voltage. In the second or opposite orientation of the response element, a pressure wave with a positive onset results in an electrical voltage response signal of the opposite polarity. That is, a positive pressure wave produces a negative electrical voltage.

When the elements are connected together, the electrical equivalent connection is as if they were connected in parallel. Assuming that all of the elements in the array are connected in the same polarity orientation, e.g., all connected for positive response, then the voltage signal outputs would be cumulative for a commonly received pressure wave. Of course, because of the spacing and the weighting of the individual receivers, a passing wave may not be received exactly simultaneously, but for the consideration at hand, the receivers are deemed to be properly oriented to produce pressure-additive results. Such a response not only produces the largest response possible for the sensitivity of the receivers, but interpreting the results will be meaningful since the measurements are treated and assumed to be from receivers connected in the same polarity.

To more fully appreciate what one or more reverse hydrophone receiver connection will do, please appreciate that while all of the properly polarity-oriented elements are producing positive response voltages, the improperly polarity-oriented elements are producing negative response voltages. Hence, instead of an additive response being produced by all of the receivers, some would be substractive. Not only would the resultant cummulative signal voltage be smaller than an all-additive cummulative signal voltage, but the total voltage output would be erroneous. Also, the erroneousness would not be predictable, because the data would not indicate which or how many of the receiver elements were reverse connected. Furthermore, the data would not appear to be in error. That is, the data would "look" proper or have the proper appearance. In summary, to have one or more individual receiver elements connected in reverse polarity is completely unacceptable.

In manufacturing a cable section, one after another of the hydrophone receivers are wired into place, along with the other internal wiring and other parts of the cable. Although there are quality control procedures established for the manufacture of a cable, the cable sections must again be tested aboard ship before the cable sections are accepted for being put into service. A seismic operating crew chief cannot abide or accept a "bad" cable section. In order to test that each hydrophone is properly connected into its array, a meter or oscilloscope is connected to the output of the cable section (or possibly the entire cable) and each hydrophone receiver is subjected to pressure by tapping (so-called "tap test") while the meter or scope is observed. An onset swinging of the meter or squiggle on the scope screen in the same direction for each of the pressurized receivers indicates that all of the receivers are commonly polarity-connected. If pressurizing any one of the receivers causes an opposite swing of the meter from the other receivers, it is reverse wired into the cable section, and, therefore, that cable section must be rejected for service. Needless to say, such testing is time-consuming and tedious, particularly considering that cable section after cable section must be tested. Such procedure also is not free from possible error because after watching a swinging needle or a squiggle on a scope screen for a long period of time, there is a certain mesmerizing that takes place resulting in the tester possibly mistaking an onset negative swing for an onset positive swing.

Therefore, it is a feature of the present invention to provide an improved polarity testing circuit for relatively quickly determining if all of the hydrophone receivers included in a cable section are connected in the same polarity.

It is another feature of the present invention to provide an improved manufacturing arrangement, wherein each hydrophone is connected with components so as to enable the assembled cable section for external testing for proper polarity connection of all hydrophone receivers.

SUMMARY OF THE INVENTION

Each hydrophones receiver pressure acceleration response element is connected in its assembly so that electrically the element is in parallel with a series combination of a switching diode and a zener diode. The switching diode and the zener diode are connected to the positive voltage terminal of the hydrophone. With such a network assembly connection, each hydrophone can be tested for individual approval before it leaves the manufacturing area to ensure that these two diodes are oriented with respect to its response element exactly in the same fashion as for every other hydrophone being manufactured.

The hydrophones, including the attached diodes just described, are then assembled into the cable section in the manner for manufacturing the cable. That is, each hydrophone is separated or spaced along the cable section at the predetermined proper position and connected individually or into an array group, if such connection is proper for that particular cable section.

A test circuit, which may be located either in the cable manufacturing facility or aboard ship, or both, is connected to the input of the assembled cable section. The test circuit includes a dc voltage reference and two resistors in series therewith. One of the resistors also is connected in parallel or shunt with the hydrophone response elements of the cable section. Assuming that all of the hydrophones are properly connected, the switching diodes are all rendered non-conductive and the output voltage will register a relative high voltage $V_{dc}$, essentially the same voltage as the junction voltage between the two resistors. On the otherhand, if any one or more of the hydrophone receiver elements are reverse connected, the switching diode for that hydrophone receiver element will be rendered conductive and the output voltage will be established at the zener breakdown voltage $V_Z$ level, a level much lower than high voltage $V_d$ level. Therefore, with one reading, an entire cable length can be tested. There are no transient swings of a meter or squiggles on an oscilloscope being observed.

Theoretically, several sections can be tested together, although single section testing is the most probable procedure.

The optimum level of the test voltage can be established with respect to the protection circuit and the shipboard electronic circuits to be connected to the cable. These conditions also establish the optimum selection of the zener breakdown voltage level and, hence, the zener diode selection.

BRIEF DESCRIPTION OF THE DRAWINGS

So that the manner in which the above-recited features, advantages and objects of the invention, as well as others which will become apparent, are attained and can be understood in detail, more particular description of the invention briefly summarized above may be had by reference to the embodiments thereof which are illustrated in the drawings, which drawings form a part of this specification. It is to be noted, however, that the appended drawings illustrate only a preferred embodiment of the invention and are therefore not to be considered limiting of its scope, as the invention may admit to other equally effective embodiments.

In the Drawings

DESCRIPTION OF THE PREFERRED EMBODIMENT

Figure 1:
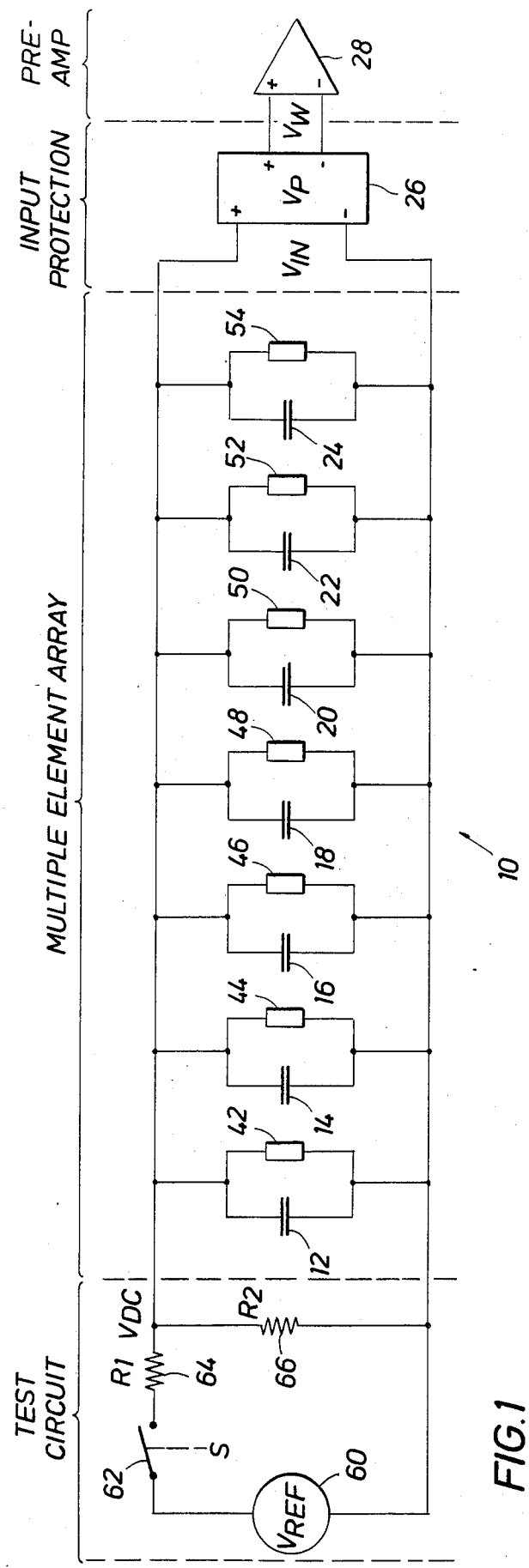
FIG. 1 is a simplified schematic diagram of a cable section array of hydrophone receiver response elements connected to a test circuit in accordance with a preferred embodiment of the present invention.

Now referring to the drawings and first to FIG. 1, a schematic diagram is shown of a multiple element array of hydrophone pressure response elements in accordance with the present invention. In a typical example a seismic cable section 10 comprises a group of seven hydrophone response elements 12, 14, 16, 18, 20, 22, and 24 electronically connected in parallel. Each of the response elements may be considered to be electronically equivalent to that of a piezoelectric crystal, which is almost a pure capacitive element.

To explain the operation of the cable assembly just described without the test circuit, acoustic pressure is applied as a result of acoustic seismic reflection against each of the hydrophones. Such pressure results in a proportional electronic signal voltage from the hydrophone response elements, which determines with the other electronic signals from the other hydrophones in the group the composite output from the cable section. The output just described is constantly fluctuating in nature, which the response elements are sensitive to in order to create the composite output. The output is applied as a voltage signal $V_{IN}$ to an electronic protection circuit 26. The circuit will not accept voltages above a voltage level $V_p$ before such voltages are clipped. Hence, the circuit protects against voltages which are in excess of such predetermined voltage value $V_p$.

The output of the protection circuit is somewhat smaller than the permitted input and is applied as signal voltage $V_W$ as the input to the first pre-amplifier stage 28 of the shipboard electronics. The largest signal from the protection circuit applied as input signal voltage $V_W$ to pre-amplifier 28 is the largest meaningful seismic signal input designed for the cable section previously described to produce.

As mentioned in the introductory portion set forth above, each of the response elements are intended for proper operation by having an identical orientation within the cable connection. That is, each of the response elements responds in the same initial electrical direction or polarity with respect to applied pressure. The tests which are to be described hereinafter determine whether or not such connections have indeed been made.

Figure 2:
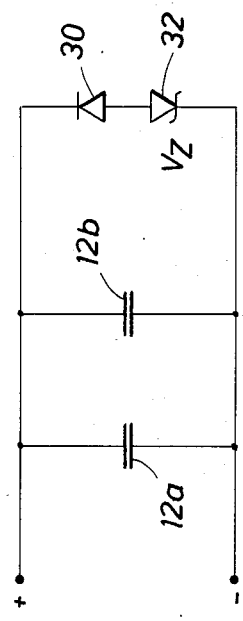
FIG. 2 is a simplified schematic diagram of a single hydrophone receiver response element connected to a test network in accordance with the present invention.

Prior to assembly of the response elements into the cable section as described above, a response element, representatively identified as capacitor 12a and 12b in FIG. 2 (which is the same as the electrical equivalent of a response element 12, 14, 16, 18, 20, 22 or 24 in FIG. 1) are connected in parallel with a series combination of switching diode 30 and zener diode 32. These two diodes are connected preferably anode-to-anode and further, switching diode is connected to the positive terminal of the receiver response element. The zener diode is connected to the negative terminal thereof. Alternatively, these two diodes could be connected cathode-to-cathode.

Each of the hydrophone receiver response elements is similarly wired to that shown in FIG. 2. It is particularly important that each response element is similarly wired because as will be explained hereinafter the connection of diodes 30 and 32 make it possible to test the entire cable section at one time to ensure that all of the hydrophone response elements are identically oriented within the cable section. This assurance testing is only possible if the individual receiver elements are all properly connected to begin with.

Returning to FIG. 2, a positive dc voltage input will cause a reverse biasing of diode 30 and hence the voltage across diodes 30 and 32 will remain the same as the input voltage. A negative input, however, would result in the establishment of the conduction of diode 30. Hence, the voltage output of the two diodes taken together will be the same as the zener breakdown voltage of zener diode $V_Z$ plus the forward bias drop of the switching diode, which is typically 0.6 volts. Of course, the applied voltage would have to be a voltage level which is in excess of such zener breakdown voltage plus 0.6 volts, in this example.

Now referring to FIG. 1, it will be seen that each receiver element network includes a series diode combination connected in parallel with the response crystal as set forth in FIG. 2. That is, combination 42 is connected in parallel with response element 12, combination 44 is connected to response element 14, combination 46 is connected to response element 16, combination 48 is connected in parallel with response element 18, diode combination 50 is connected in parallel with receiver element 20, combination 52 is connected to receiver element 22 and combination 54 is connected in parallel with receiver element 24.

The test circuit which is connected to the cable section includes a voltage reference 60 in parallel with a switch 62, a first resistor 64 and a second resistor 66. A voltage is established as a junction of resistors 64 and 66 which is illustrated in the drawing as voltage $V_{dc}$. Resistor 66 is connected in parallel to each of the hydrophone receiver elements.

It may be remembered that when all of the hydrophone elements are connected in the proper orientation as shown in FIG. 2, the output from the cable section is substantially the same as voltage $V_{dc}$. However, if any one of the receiver elements is reverse connected into the cable section, then the output will be zener breakdown voltage $V_Z+0.6$ volts.

As previously noted, the following defined voltage relationship exist:

$V_{dc}$ is a dc voltage that is established at the junction of resistors 64 and 66 when switch 62 is closed and a period of time has passed to allow transients to settle.

$V_Z$ is the zener breakdown voltage for zener diode 32 or the corresponding zener diode in the other receiver element networks.

$V_{IN}$ is the average voltage of the receiver elements.

Voltage $V_P$ is the maximum voltage that is allowed to be passed into protection circuit 26 without being clipped.

$V_{ref}$ is the dc voltage that is produced by test voltage source 60.

$R_1$ is the series resistor of the test network.

$R_2$ is the resistor in series with resistor $R_1$ of the test network and in shunt with the cable section under test.

Finally, voltage $V_W$ is the maximum voltage level which is considered to be a meaningful or "good" for a seismic signal applied to the pre-amplifier of the shipboard electronics.

The following conditions apply:

$$V_{dc} = \frac{R_2}{(R_2 + R_1)} \times V_{ref}$$

$V_Z < V_{dc} - 0.6$ (voltage drop of diode 30).
$V_Z > V_W$.
$V_Z < V_P$.

Although the discussion above describes equipping each hydrophone receiver element with a diode combination as described, several hydrophones may be arranged as a group prior to assembly into the cable section, wherein a single combination of a switching diode and a zener diode is connected to such group.

It may be apparent that a typical streamer cable is made up of many sections. There may be, for example, 240 sections of hydrophone arrays, each array comprising seven hydrophones. By testing the cable section or a group at a time, it is quickly determined whether the groups are connected to in common polarity or there is one or more of the elements reversed. The entire 240 sections can be tested in a manner of minutes compared with an all day testing of the cables using the prior art tap test method.

Of course, a particular cable section can include more than one array or partial array of hydrophones. Connections can be provided for testing each array or partial array separately, if desired, or for testing the entire cable together.

The procedure and networks described above utilize dc voltage for testing since the electrically capacitive response elements of the hydrophones appear as open circuits to a dc voltage. Hence, the diode connection arrangement is sensed to control the determination of the orientation of the hydrophone response elements. By contrast, once the response is determined to have all of the response elements properly connected, then the elements respond to the seismic fluctuations, which are essentially ac type of fluctuations and of amplitudes less than the working voltage of the recording instrument. The diodes do not interfere or enter into the response sensitivity of the hydrophones.

While a particular embodiment of the invention has been shown and described, with certain alternate variations suggested, it will be understood that the invention is not limited thereto, since many modifications may be made and will become apparent to those skilled in the art.

What is claimed is:

1. A polarity test circuit for determining that all of the hydrophone receivers in a hydrophone array are connected in the same polarity, each of said hydrophone receivers including a pressure acceleration response element, each response element having a proper polarity response orientation, each response element also exhibiting a predominantly capacitive impedance, comprising a plurality of receiver networks, one each for each respective hydrophone, including
a switching diode,
a zener diode connected in series with said switching diode and in opposite polarity therewith,
said switching diode and zener diode series combination connected in parallel with the hydrophone response element,
each of said switching diode and zener diode combinations being connected in the same orientation with respect to the respective response element to which the combination is connected, and so that with a voltage of proper polarity applied to said combination said switching diode is reversed biased,
said plurality of receiver networks arrayed-connected in parallel with each other, and
a test network, including
a reference voltage source for producing a predetermined reference dc voltage,
a series resistor connected in series with said voltage source,
a shunt resistor connected in series with said voltage source and said series resistor and in parallel with each of said receiver networks,
voltage dc at the junction between said series resistor and said shunt resistor being connected with the proper polarity orientation connection of said switching diodes and being greater than the zener breakdown voltage when reverse connected therewith, wherein the parallel connection of all receivers in the proper polarity response orientation produces a voltage value output substantially equal to said voltage dc for said arrayed-connected networks, the output being equal to a lower voltage of substantially the zener breakdown voltage output when at least one of said receivers is not in the proper response orientation.

2. A polarity test circuit in accordance with claim 1, and including a switch in series with said voltage source.

3. A polarity test circuit in accordance with claim 1, wherein said switching diode and said zener diode are connected anode-to-anode.

4. A polarity test circuit in accordance with claim 1, wherein the arrayed-connected receiver networks are connected to a protection network which will not accept voltage values above an acceptable protection voltage $V_P$, said voltage $V_{dc}$ being established substantially at voltage $V_P$, said zener breakdown voltage being less than said acceptable protection voltage $V_P$.

5. A polarity test circuit in accordance with claim 4, wherein the arrayed-connected receiver networks are designed to produce a maximum, meaningful seismic signal voltage $V_W$ value less than said protection voltage $V_P$, said zener breakdown voltage being greater than said meaningful seismic signal voltage $V_W$.

6. A polarity test circuit for determining that all of the hydrophone receivers in a hydrophone array are connected in the same polarity, each of said hydrophone receivers including a pressure acceleration response element, each response element having a proper polarity response orientation, each response element also exhibiting a predominantly capacitive impedance, comprising
 a plurality of receiver networks, one each for a respective functioning group of hydrophones, including
  a switching diode,
  a zener diode connected in series with said switching diode and in opposite polarity therewith,
  said switching diode and zener diode series combination connected in parallel with the hydrophone response element,
  each of said switching diode and zener diode combinations being connected in the same orientation with respect to the respective response elements to which the combination is connected and so that with a voltage of proper polarity applied to said combination said switching diode is reversed biased,
 said plurality of receiver networks arrayed-connected in parallel with each other, and
 a test network, including
  a reference voltage source for producing a predetermined reference dc voltage,
  a series resistor connected in series with said voltage source,
  a shunt resistor connected in series with said voltage source and said series resistor and in parallel with each of said receiver networks,
  voltage dc at the junction between said series resistor and said shunt resistor being connected with the proper polarity response orientation connection of said switching diodes and being greater than the zener breakdown voltage when reverse connected therewith, wherein the parallel connection of all receivers in the proper polarity response orientation produces a voltage value output substantially equal to said voltage dc for said arrayed-connected networks, the output being equal to a lower voltage of substantially the zener breakdown voltage output when at least one of said receivers is not in the proper response orientation.

7. A hydrophone receiver test network subcombination for providing an orientation test connection to a hydrophone receiver including a pressure acceleration response element, said response element having a proper polarity response orientation and also exhibiting a predominantly capacitive impedance, comprising
 a switching diode,
 a zener diode connected in series with said switching diode and in opposite polarity therewith,
 said switching diode and zener diode combination connected in parallel with the hydrophone response element in a predetermined orientation with respect to the proper polarity response orientation of said response element so that with a test voltage of proper polarity at a higher level than the reverse zener breakdown voltage of said zener diode applied thereto said switching diode is reversed biased to result in an output at said test voltage level and so that with said test voltage of reverse polarity applied thereto said zener diode breaks down to result in an output at said zener diode breakdown level.

8. A hydrophone receiver test network subcombination in accordance with claim 7, wherein said switching diode is connected with its cathode to the positive input terminal of the network.

9. A hydrophone receiver test network subcombination in accordance with claim 7, wherein said switching diode and said zener diode are connected anode-to-anode.

10. A hydrophone receiver test network subcombination for providing an orientation test connection to a group of commonly connected hydrophone receivers, each receiver including a pressure acceleration response element, the response elements of said group being properly connected together and having a proper polarity response orientation, said group also exhibiting a predominantly capacitive impedance, comprising
 a switching diode,
 a zener diode connected in series with said switching diode and in opposite polarity therewith,
 said switching diode and zener diode combination connected in parallel with said group of hydrophone response elements in a predetermined orientation with respect to the proper polarity response orientation of said group so that with a test voltage of proper polarity at a higher level than the reverse zener breakdown voltage of said zener diode applied thereto said switching diode is reversed biased to result in an output at said test voltage level and so that with said test voltage of reverse polarity applied thereto said zener diode breaks down to result in an output at said zener diode breakdown level.

* * * * *